United States Patent
Tzou et al.

(10) Patent No.: US 8,149,643 B2
(45) Date of Patent: Apr. 3, 2012

(54) MEMORY DEVICE AND METHOD

(75) Inventors: Joseph Tzou, Mountain View, CA (US); Thinh Tran, Palo Alto, CA (US); Jun Li, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 253 days.

(21) Appl. No.: 12/288,984

(22) Filed: Oct. 23, 2008

(65) Prior Publication Data

US 2010/0103762 A1 Apr. 29, 2010

(51) Int. Cl.
*G11C 8/00* (2006.01)
(52) U.S. Cl. .................. 365/230.03; 365/233.1; 365/239
(58) Field of Classification Search ............. 365/230.03, 365/233.1, 239
See application file for complete search history.

(56) References Cited

U.S. PATENT DOCUMENTS

| | | | |
|---|---|---|---|
| 4,649,522 A | 3/1987 | Kirsch | |
| 4,752,871 A | 6/1988 | Sparks et al. | |
| 4,901,282 A | 2/1990 | Kobayashi | |
| 5,506,992 A | 4/1996 | Saxenmeyer | |
| 5,530,673 A | 6/1996 | Tobita et al. | |
| 5,546,569 A | 8/1996 | Proebsting et al. | |
| 5,566,170 A | 10/1996 | Bakke et al. | |
| 5,581,199 A | 12/1996 | Pierce et al. | |
| 5,657,292 A | 8/1997 | McClure | |
| 5,717,647 A | 2/1998 | Hush | |
| 5,726,990 A | 3/1998 | Shimada et al. | |
| 5,781,480 A | 7/1998 | Nogle et al. | |
| 5,781,769 A | 7/1998 | Weber | |
| 5,828,606 A | 10/1998 | Mick | |
| 5,838,631 A | 11/1998 | Mick | |
| 5,841,732 A | 11/1998 | Mick | |
| 5,875,151 A | 2/1999 | Mick | |
| 5,892,730 A | 4/1999 | Sato | |
| 5,920,511 A | 7/1999 | Lee | |
| 5,923,613 A | 7/1999 | Tien | |
| 5,930,359 A | 7/1999 | Kempke et al. | |
| 5,956,286 A | 9/1999 | Lattimore et al. | |
| 5,963,972 A | 10/1999 | Calder et al. | |
| 5,970,070 A | 10/1999 | Ho et al. | |
| 5,973,991 A | 10/1999 | Tsuchida | |
| 5,978,279 A | 11/1999 | Park | |
| 5,978,281 A | 11/1999 | Anand | |
| 5,991,232 A | 11/1999 | Matsumura | |
| 5,991,233 A | 11/1999 | Yu | |
| 6,011,751 A | 1/2000 | Hirabayashi | |
| 6,016,283 A | 1/2000 | Jeong | |
| 6,026,050 A | 2/2000 | Baker et al. | |
| 6,034,911 A * | 3/2000 | Aimoto et al. | ........... 365/230.03 |
| 6,034,916 A | 3/2000 | Lee | |
| 6,044,026 A | 3/2000 | Morgan | |

(Continued)

FOREIGN PATENT DOCUMENTS

JP 1221911 A 9/1989

(Continued)

OTHER PUBLICATIONS

USPTO Notice of Allowance for U.S. Appl. No. 10/871,825 dated Jul. 27, 2006; 4 pages.

(Continued)

*Primary Examiner* — Huan Hoang (57) ABSTRACT

A memory device and method may include separating alternating read and write accesses to different banks of a memory device.

20 Claims, 5 Drawing Sheets

U.S. PATENT DOCUMENTS

| | | | |
|---|---|---|---|
| 6,052,329 | A | 4/2000 | Nishino |
| 6,061,295 | A | 5/2000 | Roh |
| 6,061,296 | A | 5/2000 | Ternullo |
| 6,069,839 | A | 5/2000 | Pancholy et al. |
| 6,081,478 | A | 6/2000 | Mick et al. |
| 6,094,399 | A | 7/2000 | Mick |
| 6,233,242 | B1 | 5/2001 | Mayer et al. |
| 6,256,313 | B1 | 7/2001 | Chung |
| 6,262,936 | B1 | 7/2001 | Arcoleo et al. |
| 6,262,937 | B1 | 7/2001 | Arcoleo et al. |
| 6,275,441 | B1 | 8/2001 | Oh |
| 6,275,861 | B1 | 8/2001 | Chaudri et al. |
| 6,282,150 | B1 | 8/2001 | Edo |
| 6,378,008 | B1 | 4/2002 | Gradinariu et al. |
| 6,385,128 | B1 | 5/2002 | Arcoleo et al. |
| 6,426,662 | B1 | 7/2002 | Arcus |
| 6,556,483 | B2 | 4/2003 | Ryan et al. |
| 6,606,274 | B2 | 8/2003 | Ooishi et al. |
| 6,606,360 | B1 | 8/2003 | Dunning et al. |
| 6,614,371 | B2 | 9/2003 | Zhang |
| 6,662,315 | B1 | 12/2003 | Gradinariu et al. |
| 6,700,429 | B2 | 3/2004 | Kanno et al. |
| 6,700,809 | B1 | 3/2004 | Ng et al. |
| 6,728,157 | B2 | 4/2004 | Yagishita et al. |
| 6,876,558 | B1 | 4/2005 | James et al. |
| 6,934,199 | B2 | 8/2005 | Johnson et al. |
| 6,982,575 | B2 | 1/2006 | Stong |
| 6,985,096 | B1 | 1/2006 | Sasaki et al. |
| 7,006,404 | B1 | 2/2006 | Manapat et al. |
| 7,085,905 | B2 | 8/2006 | Chao |
| 7,132,854 | B1 | 11/2006 | Chen et al. |
| 7,135,899 | B1 | 11/2006 | Sancheti et al. |
| 7,142,477 | B1 | 11/2006 | Tran et al. |
| 7,308,058 | B2 | 12/2007 | Zerbe et al. |
| 7,535,722 | B2 | 5/2009 | Parameswaran et al. |
| 2005/0108600 | A1 | 5/2005 | Arguelles |

FOREIGN PATENT DOCUMENTS

| | | | |
|---|---|---|---|
| JP | 7221605 | A | 8/1995 |
| JP | 9320269 | A | 12/1997 |

OTHER PUBLICATIONS

USPTO Non-Final Rejection for U.S. Appl. No. 10/871,825 dated Apr. 14, 2006; 8 pages.
USPTO Requirement Restriction for U.S. Appl. No. 10/871,825 dated Mar. 1, 2006; 5 pages.
USPTO Notice of Allowance for U.S. Appl. No. 10/810,038 dated Sep. 8, 2005; 4 pages.
USPTO Non-Final Rejection for U.S. Appl. No. 10/810,038 dated May 16, 2005; 7 pages.
USPTO Notice of Allowance for U.S. Appl. No. 10/949,537 dated Jun. 21, 2006; 4 pages.
USPTO Non-Final Rejection for U.S. Appl. No. 10/949,537 dated Feb. 10, 2006; 8 pages.
USPTO Notice of Allowance for U.S. Appl. No. 10/844,719 dated Jul. 14, 2006; 6 pages.
USPTO Non-Final Rejection for U.S. Appl. No. 10/844,719 dated Apr. 5, 2006; 6 pages.
USPTO Non-Final Rejection for U.S. Appl. No. 10/844,719 dated Sep. 20, 2005; 8 pages.
USPTO Notice of Allowance for U.S. Appl. No. 10/877,932 dated Jan. 12, 2009; 7 pages.
USPTO Non-Final Rejection for U.S. Appl. No. 10/877,932 dated Jun. 24, 2008; 11 pages.
USPTO Requirement Restriction for U.S. Appl. No. 10/877,932 dated Feb. 28, 2008; 6 pages.
USPTO Notice of Allowance for U.S. Appl. No. 10/264,883 dated Nov. 16, 2004; 6 pages.
USPTO Non-Final Rejection for U.S. Appl. No. 10/264,883 dated Jun. 4, 2004; 9 pages.
USPTO Miscellaneous Action for U.S. Appl. No. 10/264,883 dated Nov. 4, 2002; 1 page.
Cypress Data Sheet: 18-Mb QDR-II SRAM 2-Word Burst Architecture Revised Jun. 1, 2004; 22 pages.
"General DDR SDRAM Functionality," (C) 2001 Micron Technology, Inc., pp. 1-11.
USPTO Notice of Allowance for U.S. Appl. No. 09/238,953 dated Mar. 8, 2001; 2 pages.
USPTO Ex Parte Quayle for U.S. Appl. No. 09/238,953 dated Jan. 18, 2001; 6 pages.
USPTO Restriction Requirement for U.S. Appl. No. 09/238,953 dated Sep. 18, 2000; 5 pages.
USPTO Non-Final Rejection for U.S. Appl. No. 09/238,953 dated Mar. 27, 2000; 8 pages.
USPTO Non-Final Rejection for U.S. Appl. No. 09/238,953 dated Oct. 28, 1999; 7 pages.
USPTO Notice of Allowance for U.S. Appl. No. 09/238,954 dated Mar. 8, 2001; 2 pages.
USPTO Ex Parte Quayle for U.S. Appl. No. 09/238,954 dated Jan. 18, 2001; 6 pages.
USPTO Restriction Requirement for U.S. Appl. No. 09/238,954 dated Sep. 18, 2000; 5 pages.
USPTO Non-Final Rejection for U.S. Appl. No. 09/238,954 dated May 17, 2000; 9 pages.
USPTO Non-Final Rejection for U.S. Appl. No. 09/238,954 dated Dec. 9, 1999; 7 pages.
USPTO Notice of Allowance for U.S. Appl. No. 09/238,270 dated Jan. 19, 2000; 5 pages.
USPTO Non-Final Rejection for U.S. Appl. No. 09/238,270 dated Oct. 26, 1999; 5 pages.
Application Number 11-073239 Final Rejection OA dated Mar. 15, 2011; 2 pages.

* cited by examiner

MEMORY DEVICE AND METHOD

TECHNICAL FIELD

The present disclosure relates generally to memory devices and operations.

BACKGROUND

Memory devices may read and write data to memory cells, typically arranged into one or more arrays. Memory arrays may be organized into separately addressable groups, sometimes referred to as banks.

A time between the reception of a read address and the outputting of read data from a memory array within a bank, may be considered a bank read access time period Tread (Bank). Such a time period may include a precharge period during which a read address may be decoded and bit lines may be precharged. Such a time period may also include a sense period during which memory cells can be connected to bit lines, and data values on such bit lines amplified for subsequent output. It is noted that such amplified data may be subsequently output at a read register.

Similarly, a time between reception of a write address, and the storing of write data in memory cells within an accessed bank may be considered a bank write access time period Twrite(Bank). Such a time period may include a precharge period, during which a write address may be decoded, bit lines precharged, and write data may be input and applied to write amplifiers. Such a time period may also include a write period during which memory cells can be connected to bit lines, and such bit lines driven by write amplifiers to thereby write data into the memory cells.

DETAILED DESCRIPTION

Various embodiments will now be described that show memory devices and methods for separating alternating read and write accesses to different banks of a memory device. In embodiments, such an arrangement may increase data access speeds as an access in one bank need not be complete for an access to another bank to be initiated.

Figure 1:
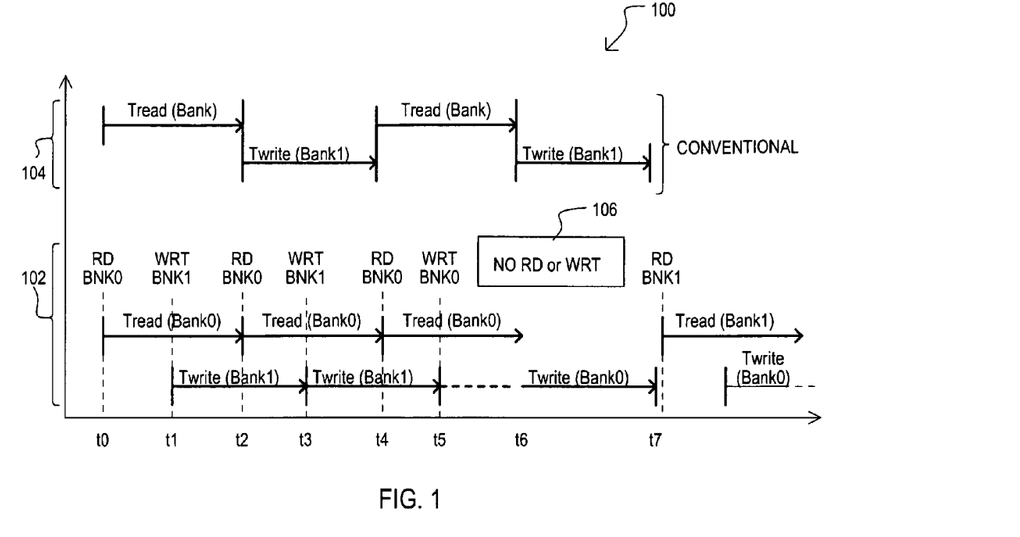
FIG. 1 is a diagram showing an access method according to an embodiment.

Referring to FIG. 1, an access method according to a first embodiment is shown in a timing diagram designated by the general reference character 100. Timing diagram includes a sequence 102 of operations according to one embodiment. A sequence 104 of operations is shown for a device that does not include rapid alternate bank accesses like that of the embodiment shown in 102.

Sequence 102 shows sequential, alternating, read and write operations to different banks of a memory device. Thus, as time t0, a read operation to a first bank (RD BNK0) may be initiated. Such a read operation may proceed to completion in a read access time period Tread(Bank0). Such a time period may include a time between the reception of a read address, and the output of read address from a first bank (Bank0). It is understood that such a time period may be considerably less than a "clock to data out" time period, which may include numerous output stages for propagating data from a bank to outputs of a memory device.

Referring still to FIG. 1, at a time t1, a write operation to a second bank (WRT BNK1) may be initiated. Unlike the sequence 104, such a write operation may be started prior to the end of the read access period Tread for the previous read operation (RD BNK0) because write data may be designated to correspond to second bank (Bank 1) and hence not interfere with operations in first bank (Bank 0).

As shown in FIG. 1, back-to-back read operations (e.g., those occurring at times t0 and t1) may be executed in a shorter time period than back-to-back read operations to a same bank. That is, t3–t0 may be less than Tread(Bank0)+Twrite(Bank0) or Tread(Bank1)+Twrite(Bank1).

A comparison between sequence 102 according to an embodiment and sequence 104 shows that access speeds may be significantly increased over the case of sequence 104.

Referring again to FIG. 1, one example of a bank switching operation is also shown in sequence 102. A bank switching operation may occur when a sequence of accesses switches from one bank to another bank. In the particular embodiment of FIG. 1, from times t0 to t4, read accesses are from a same bank (Bank 0) while write accesses are to a different bank (Bank 1). Thus, a bank switching operation will switch to read accesses to a different bank (Bank 1), and write accesses to a different bank (Bank 0), than a previous sequence.

According to the embodiment shown, prior to such a bank switching operation, a sequence may execute particular actions to ensure sufficient time is included for any write latency. In the example shown, such actions may include read and write operations to a same bank prior to the bank switch. Thus, at time t4, a read operation to Bank 0 may be followed at time t5 with a write operation to the same bank (Bank 0). Because such back-to-back operations are to a same bank, actual access to the bank for the write operation may not start until after the prior read access is complete. This is shown in FIG. 1 by a Twrite(Bank0) access period starting at about time t6 and not time t5). Such an arrangement may ensure that a write to Bank 1 starting at time t3, is completed prior to a read from the same bank starting at time t7. In addition or alternatively, all write and read operations may be suspended following a last write operation prior to a bank change. Such an operation is shown as item 106 in FIG. 1.

At time t7, a bank switching operation may be complete, and alternating read accesses to Bank 1 and write accesses to Bank 0 may continue.

In this way, alternating read and write accesses may be executed to different banks. A time period between sequential read accesses may be less than a sum of a bank read access time and a bank write access time.

Figure 2:
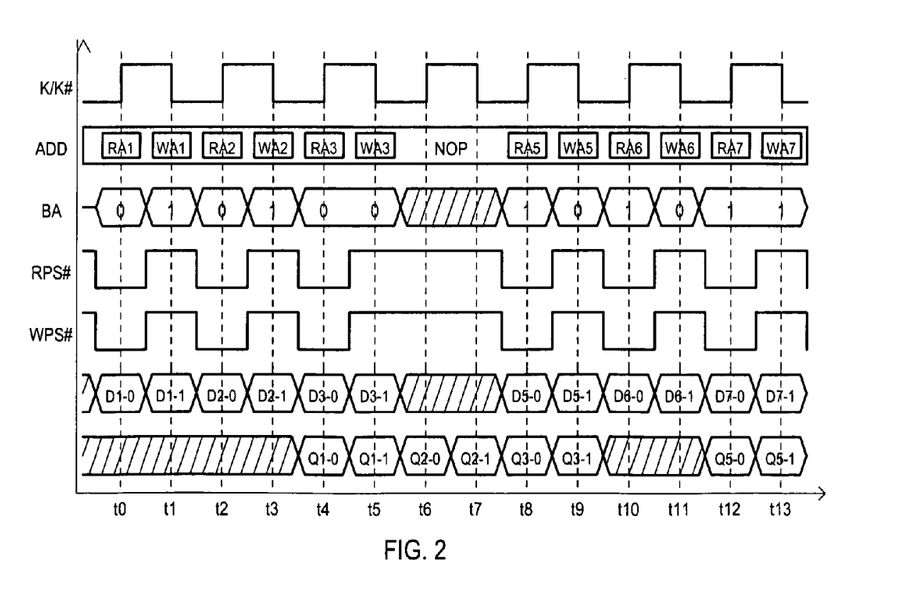
FIG. 2 is a timing diagram showing a memory device access method according to another embodiment.

Referring to FIG. 2, another timing diagram shows an example of memory device accesses according to another embodiment. In particular embodiments, FIG. 2 may be one detailed example of that shown in FIG. 1. FIG. 2 shows particular sequences of read and write operations for a memory device. FIG. 2 is a timing diagram having waveforms for a clock signal K/K#, an applied address ADD, a bank address BA, a read enable signal RPS# (that is active low), a write enable signal WPS# (that is active low, and precedes the corresponding write address), read data READ DATA, and write data WRITE DATA. Read operations are alternated with write operations as shown by the applied addresses (RAx are read addresses, WAx are write addresses, where x is a number).

At time t0, a read address (RA1) may be applied to a memory device. At the same time, a bank address "0" may also be applied. It is understood that a bank address value may be generated from a received address, or controlled by a dedicated input to a memory device. Also at time t0, RPS# and WPS# are active, indicating read and write operations are to occur. In response to RA1, the bank address (BA=0), and signal RPS# at time t0, data may be read from a first bank (Bank 0).

At time t1, a write address (WA1) may be applied to a memory device, and at the same time a bank address may be switched to "1". In response to WA1, the bank address (BA=1), and signal WPS# at time t0, data may be written to a second bank (Bank 1).

Such operations may continue with read address RA2 and write address WA2 being applied at times t2 and t3, respectively, and signals RPS# and WPS# both being active at time t2.

In the embodiment of FIG. 2, read addresses may be applied in synchronism with (and the example shown, simultaneously to) rising transitions (low-to-high) of a clock signal K. Write addresses may be applied in synchronism with (and the example shown, simultaneously to) falling transitions (high-to-low) of a clock signal K. Falling transitions of clock signal K may be considered the same as rising transitions of clock signal K#, which may be the complement of clock signal K.

It is noted that a time value t2−t0 may be faster than a sum of a bank read access time and bank write access time. Accordingly, a clock signal (K) may be significantly faster than an approach like that shown as 104 in FIG. 1.

The embodiment of FIG. 2 shows operations for memory device having separate write data inputs and read data outputs, each capable of operating at a double data rate. Further, data values may be read and/or written in bursts of two. Accordingly, write data (D1−0 and D1−1) may be input in a two data burst at times t0 and t1. Similarly, read data (Q1−0 and Q1−1) may be presented at outputs in two data burst at times t4 and t5 (i.e., read operations have a two cycle latency).

At times t4 and t5, a present sequence to given banks may end in response to an anticipated bank switch. Thus, in the embodiments shown, a bank address may be the same for both read and write operations at times t4 and t5. As noted previously, such an operation may ensure sufficient time to account for any latency in write operations.

From times t6 to t8, a no operation (NOP) may occur. That is, no read or write accesses may be initiated. In the very particular example of FIG. 2, a NOP may include a read enable signal and write enable signal (RPS# and WPS#) both being maintained high (inactive).

At time t8, a bank switch may be complete and a new sequence may begin. In such a new sequence, read and write operations may alternate between Bank 1 and Bank 0, instead of between Bank 0 and Bank 1.

In this way, a memory device may include a first sequence with alternating read and write operations to different banks. Prior to changing the bank accessed by read or write operation, a "no operation" time period may be introduced.

Figure 3:
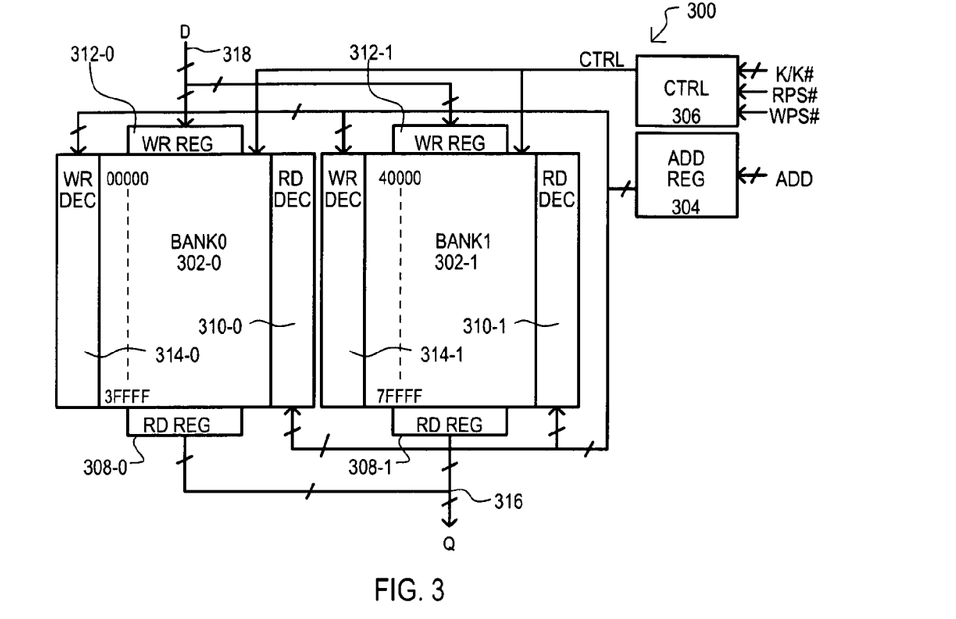
FIG. 3 is a block schematic diagram of a memory device according to one embodiment.

Referring now to FIG. 3, a memory device according to an embodiment is shown in a block schematic diagram and designated by the general reference character 300. In one very particular embodiment, a memory device 300 may execute operations like those shown in FIGS. 1 and/or 2.

A memory device 300 may include two or more banks 302-0 and 302-1, an address register 304, and a control circuit 306. Each bank (302-0 and 302-1) may have its own read register (308-0 and 308-1), read decoder (310-0 and 310-1), write register (312-0 and 312-1), and write decoder (314-0 and 314-1).

Banks (302-0 and 302-1) may include a number of memory cells arranged into one or more arrays. In one particular arrangement, such memory cells may be static random access memory (SRAM) cells. Access to memory cells of each bank (302-0 and 302-1) may take a predetermined time period due to circuitry in the bank. Thus, each bank (302-0 and 302-1) may be conceptualized as having a bank read time, which may include the time between reception of a read address (or read command indication) and output of read data from the bank (not from the read register). Similarly, each bank (302-0 and 302-1) may be conceptualized as having a bank write time, which may include the time between reception of a write address and the storage of write data in the bank.

Address register 304 may have address inputs ADD that receive both read addresses and write addresses. In one particular embodiment, an address value may be determined to be a read address based on when the address is received. Even more particularly, an address may be considered a read address if it is received on a rising edge of a clock signal (K) and considered a write address if it is received on a falling edge of clock signal (K). Address register 304 may provide address values to all read decoders (310-0 and 310-1) and write decoders (314-0 and 314-1).

Control circuit 306 may control operations in memory device 300 based on received timing signals, which in this very particular example may include clock signal (K) and its inverse (K#). In addition, control circuit 306 may receive control signals for signifying particular operations (e.g., read, write, or no operation) for memory device 300. In FIG. 3, such control signals include a read enable signal RPS# and a write enable signal (WPS#). Control circuit 306 may output control signals CTRL for controlling operations in both banks (302-0 and 302-1) and their associated circuitry.

Control circuit 306 may allow alternating read and write accesses to different banks (302-0 and 302-1). Further, during such alternating read and write accesses, sequential read accesses may occur faster than a sum of a bank read access time and bank write access time (of either bank 302-0 or 302-1). This is in contrast to approaches that may ensure such sequential read operations are no less than the sum of a bank read access time and bank write access time.

Read registers (308-0 and 308-1) may receive data provided by banks (302-0 and 302-1) in a read operation, and output such read data on read output 316.

Read decoders (310-0 and 310-1) may receive read addresses, and in response, access a location within their corresponding bank (302-0 and 302-1) to enable data to be read from such a location.

Write registers (312-0 and 312-1) may receive write data applied at write input 318 for a write operation, and apply such data to an appropriate banks (302-0 and 302-1) for storage in memory cells. Write registers (312-0 and 312-1)

may be independent of read registers (308-0 and 308-1). Thus, write data may be output as read data input.

Write decoders (314-0 and 314-1) may receive write addresses, and in response, access a location within their corresponding bank (302-0 and 302-1) to enable data to be written to such a location. It is noted that write decoders (314-0 and 314-1) may operate independently of read decoders (310-0 and 310-1). This may enable a write access to one bank, while a read access occurs in the other bank.

Referring still to FIG. 3, a memory device 300 may have bank selection built into an applied address. In particular, if an address falls within one range (e.g., 00000(hex) to 3FFFF (hex)), such an address may select Bank 0 (302-0). In contrast, if an address falls within another range (e.g., 40000(hex) to 7FFFF(hex)), such an address may select Bank 1 (302-1).

In this way, a memory device may include multiple banks, where alternating read and write operations may include read operations being executed on only one bank, and write operations being executed on only the other bank. Bank selection may be determined by an applied address value.

Figure 4:
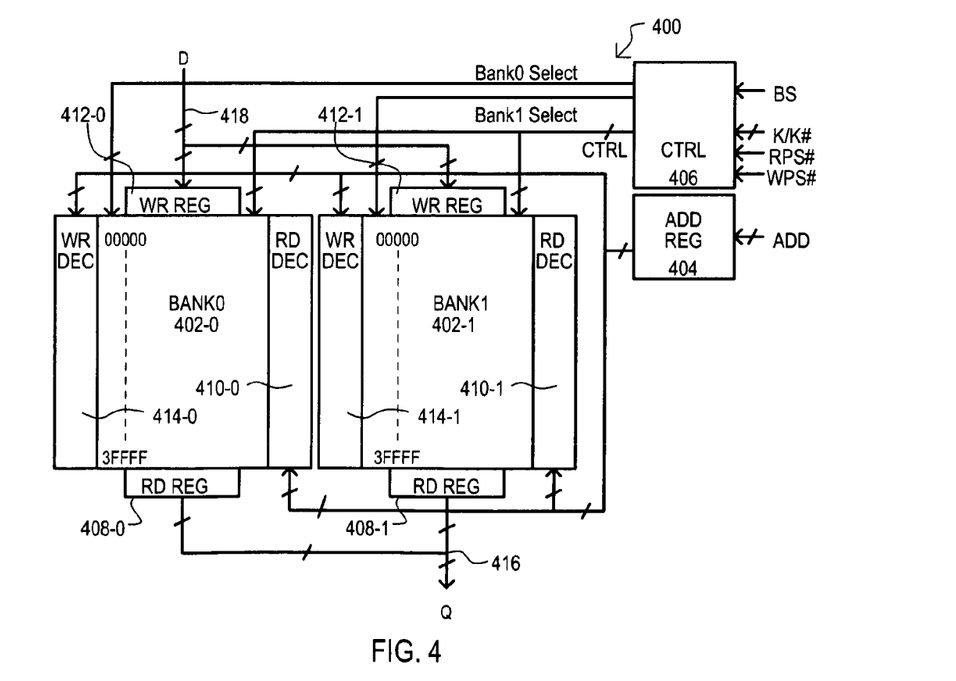
FIG. 4 is a block schematic diagram of a memory device according to a further embodiment.

Referring now to FIG. 4, a memory device according to another embodiment is shown in a block schematic diagram and designated by the general reference character 400. In one very particular embodiment, a memory device 400 may execute operations like those shown in FIGS. 1 and/or 2.

A memory device 400 may include the same general sections as that shown in FIG. 3, accordingly like sections are referred to by the same reference character but with the first digit being a "4" instead of a "3".

Memory device 400 may differ from that of FIG. 3 in that bank selection may be performed based on a dedicated input signal (BS). Accordingly, based on a value of signal BS, either bank may be selected.

In this way, a memory device may include multiple banks, where alternating read and write operations may include read operations being executed on only one bank, and write operations being executed on only the other bank. Bank selection may be determined according to a dedicated signal input.

While the embodiments of FIGS. 3 and 4 show memory devices having two banks, alternate embodiments may have more than two banks. One particular example of such an embodiment is shown in FIG. 5.

Figure 5:
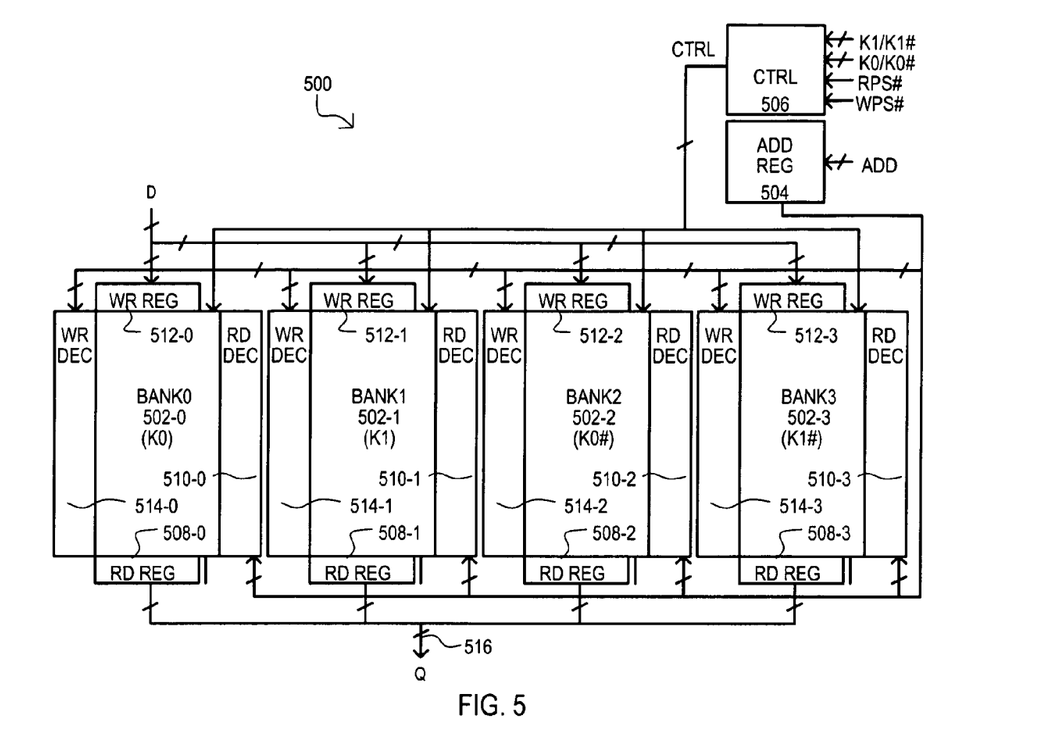
FIG. 5 is a block schematic diagram of a memory device according to another embodiment.

Referring to FIG. 5, a memory device according to another embodiment is shown in a block schematic diagram and designated by the general reference character 500. A memory device 500 may include the same general sections as that shown in FIG. 3, accordingly like sections are referred to by the same reference character but with the first digit being a "5" instead of a "3".

Memory device 500 may differ from that of FIG. 3 in that a memory device 500 may include four banks 502-0 to 502-3 that may each execute a given operation (e.g., write or read) in synchronism with a different clock signal or a different phase of a clock signal. In the arrangement of FIG. 5, banks 502-0 to 502-3 may execute operations in response to signals K0, K1, K0# and K1#, respectively. Signal K0# may be the inverse of signal K0, and signal K1# may be the inverse of signal K1.

A control circuit 506 may receive timing signals, which in this very particular example may include clock signals (K0/K1) and their inverses (K0#/K1#), as well as control signals (e.g., RPS# and WPS#). Control circuit 506 may output control signals CTRL for controlling operations in all banks (502-0 to 502-3) and their associated circuitry. Control circuit 506 may enable alternating read and write accesses to different banks (502-0 to 502-3).

Write registers (512-0 to 512-3) may be separate from read registers (508-0 to 508-3) to enable write data to be input as read data is output.

Bank selection may be determined according to a portion of an address, or by a dedicated signal input.

Figure 6:
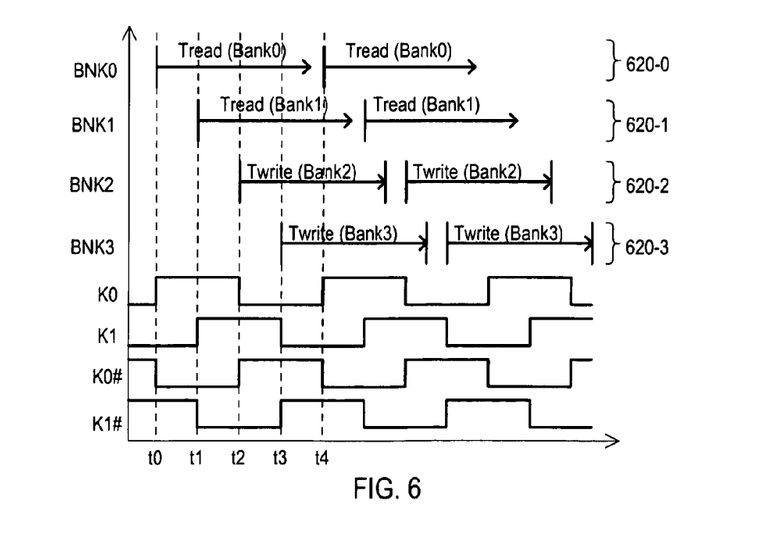
FIG. 6 is a timing diagram showing an operation of a memory device like that of FIG. 5.

One example of an operation for a memory device like that of FIG. 5 is shown in FIG. 6. FIG. 6 is a timing diagram showing examples of accesses to banks 502-0 to 502-3, as items 620-0 to 620-3, respectively. Such accesses show read access time periods (Tread) as well as write access time periods (Twrite). FIG. 6 also shows examples of clock signals K0, K1, K0# and K1#.

In FIG. 6, clocks signal K0 and K1 may be shifted from one another by about 90 degrees. Further, accesses to different banks may be coordinated, with writes to Bank 2 (502-2) occurring in a same clock cycle period as read from Bank 0 (502-0), or vice versa (write to Bank 2 502-2 occurring in a same clock cycle period as reads from Bank 0 502-0). Similarly, writes to Bank 3 (502-3) may occur in the same clock cycle period as reads from Bank 1 (502-1), and vice versa.

Referring still to FIG. 6, in the particular example shown, at time t0, a read access to Bank 0 502-0 may begin (at or in synchronism with a rising edge of clock K0).

At time t1, during a read access time period for Bank 0 (Tread (Bank0)), a read access may occur at Bank 1 502-1 (at or in synchronism with a rising edge of clock K1).

At time t2, also during the read access time for Bank 0, a write access may occur at Bank 2 502-2 (at or in synchronism with a rising edge of clock K0#).

At time t3, further during the read access time for Bank 0, a write access may occur at Bank 3 502-3 (at or in synchronism with a rising edge of clock K1#).

In this way, a memory device may include more than two banks, with alternating read and write operations being executed between predetermined bank pairs.

Figure 8:
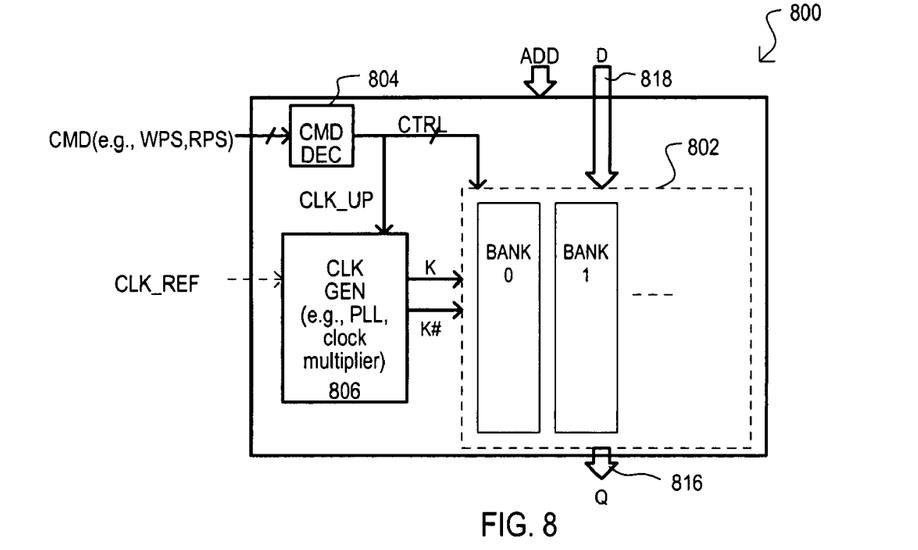
FIG. 8 is a block schematic diagram of a memory device according to a further embodiment.
Figure 9:
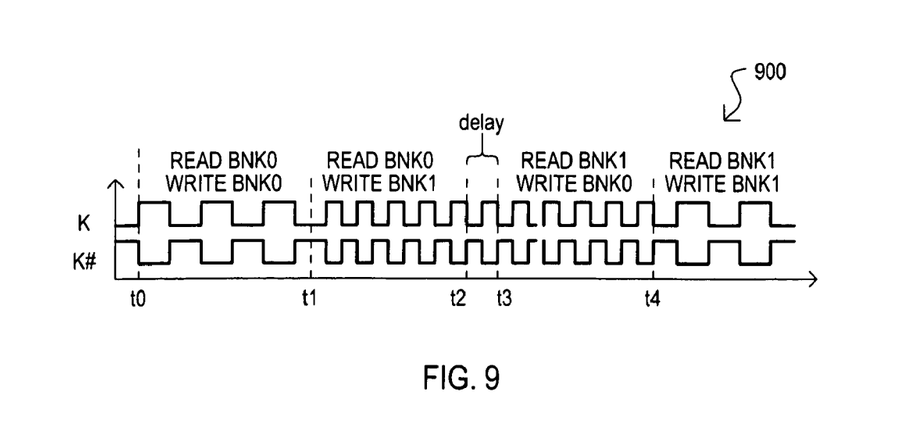
FIG. 9 is a timing diagram showing operations that may be executed by embodiments shown in FIGS. 7 and/or 8.

In embodiments above, a sequence of data read operations may be scheduled for access from one bank, while a corresponding sequence of data write operations may be scheduled to a different bank. Such accesses may enable clock rates faster than approaches that include a predetermined minimum read access time between subsequent before a write operation may occur. In particular arrangements, a memory device may operate at such higher clock rates. However, in alternate embodiments, clock rates may be adjustable. Examples of such embodiments are shown in FIGS. 7-9.

Figure 7:
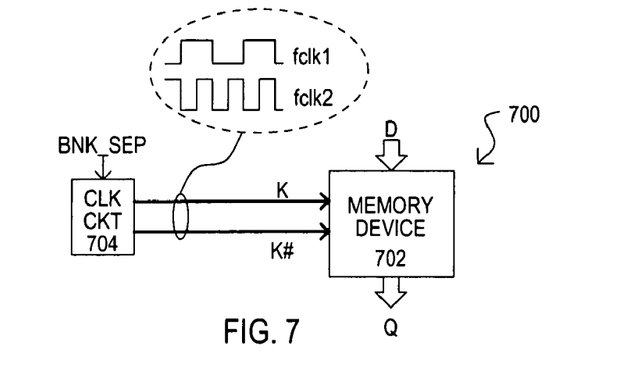
FIG. 7 is a block schematic diagram of a system according to an embodiment.

Referring to FIG. 7, a system according to one embodiment is shown in a block schematic diagram. A system 700 may include a memory device 702 and a clock generation circuit 704. The memory device 702 may be a memory device according to any of the embodiments shown herein, or equivalents. That is, The memory device 702 may include two or more banks, and may access one bank in a series of read operations, while accessing another bank in a series of write operations. However, The memory device 702 may also access a same bank for both read and write operations.

A clock generation circuit 704 may generate complementary clock signals K and K#. According to a control indication BNK_SEP, a clock generation circuit 704 may output clock signals K/K# having a first speed (fclk1) or a second, faster speed (fclk2). Accordingly, when The memory device 702 is receiving read data for one bank and write data for another bank in a same time period, a control indication BNK_SEP may have one value that results in a faster clock signal (e.g., K/K#=fclk2). However, when The memory device 702 is receiving read data and write data for a same bank in a same time period, a control indication BNK_SEP may have another value that results in a slower clock signal (e.g., K/K#=fclk2).

In this way, one or more clock signals applied to a memory device may be increased when sequences of read and operations are directed to different banks.

While FIG. 7 shows an arrangement in which an applied clock signal may be increased by a clock generation circuit external to a memory device, such variable clock generation may occur on a memory device. One such arrangement is shown in FIG. 8.

Referring to FIG. 8, a memory device according to another embodiment is shown in a block schematic diagram and designated by the general reference character 800. A memory device 800 may include a memory array section 802, a command decoder 804, and a clock generator 806. A memory array section 802 may include memory banks, address decoders, address registers, read registers and write registers as shown in embodiments above, or equivalents. Thus, memory array section 802 may receive write data at a write input 818, and output read data at a read output 816.

A command decoder 804 may receive command inputs and generate control signals for controlling various operations, including but not limited to reads and writes. In addition, in response to predetermined input values, a command decoder 804 may generate a clock control signal CLK_UP. Such a clock control signal CLK_UP may indicate a fast clock mode, such as when read and writes sequences executed to different banks in a same time period, as described above. In such an arrangement, clock speed may be increased on the fly, to enable same bank read/writes to occur at one speed, and then separate bank read/writes to occur at another, faster speed.

A clock generator 806 may generate two or more internal clocks signals K/K# that may have different speeds depending upon control signal CLK_UP. Optionally, a clock generator 806 may receive a reference clock signal CLK_REF, and frequency multiply and/or divide the reference clock signal CLK_REF to arrive at two or more speeds for internal clock signals (e.g., K/K#).

In this way, a memory device may include circuits for selecting a faster operating speed when sequences read and write accesses in a same time period are directed to different banks, and a slower operation speed when read and write operations are directed to a same bank.

Referring to FIG. 9, a timing diagram shows very particular operations that may occur in selectable speed embodiments, like those of FIGS. 7 and 8. FIG. 9 shows clock signals K/K# that may be applied to, or generated by a memory device according to the embodiments shown herein, or equivalents.

At time t0, a memory device may execute read and write operations from one bank. As but one example, a sequence of read and write operations may occur in an alternating fashion from a same bank. Clock signals K/K# may operate at a first frequency.

At time t1, in anticipation of separate bank reads and writes, clock signals K/K# may increase in frequency. In the example shown, a sequence of read and write operations may occur in an alternating fashion to different banks. In particular, read operations may occur from Bank 0 while write operations occur to Bank 1. In one example, a last write operation may be to the same bank as the read operations (Bank 0, in this case).

At time t2, in anticipation of a bank switching operation that maintains separate bank reads and writes, a delay (no operation) may occur to account for any latency a last read or write operation.

At time t3, a bank switch may occur, thus, a sequence of read and write operations may occur in an alternating fashion from different banks than between times t1 and t2. In particular, read operations may occur from Bank 1 while write operations occur to Bank 0. Again, in one example, a last write operation may be to the same bank as the read operations (Bank 1, in this case).

At time t4, in anticipation of reads and writes to a same bank, clock signals K/K# may decrease in frequency. In the example shown, a sequence of read and write operations may occur in Bank 1.

While embodiments may include memory devices, or memory devices in combination with clock generators, still other embodiments may include systems that store and transfer data to a memory device.

Figure 10:
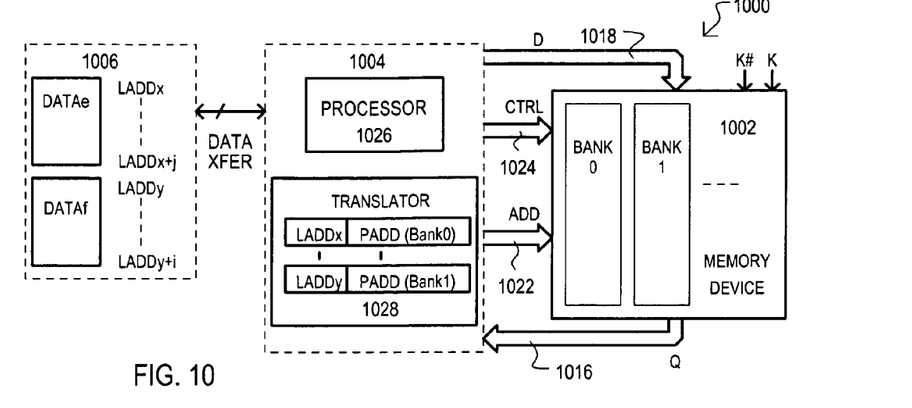
FIG. 10 is a block schematic diagram of system according to another embodiment.

Referring to FIG. 10, a system according to one embodiment is shown in a block schematic diagram and designated by the general reference character 1000. A system 1000 may include a memory device 1002, a processor system 1004, and system data 1006. A memory device 1002 may include any of the memory device embodiments shown herein or equivalents. In the particular example shown, a memory device 1002 may output read data (Q) at a read output 1016, receive write data (D) at a write input 1018, receive address values (ADD) at an address input 1022, and receive control data (CTRL) at a control input 1024.

A processor system 1004 may include a processor 1026 and an address translator 1028. A processor 1004 may execute predetermined instructions based on received commands. An address translator 1028 may translate data values received by the processor system 1004 from one domain (e.g., some logical address or logical identifier) to a physical address within memory device 1002.

System data 1006 may be divided into at least two logical groups, shown as "DATAe" and "DATAf". Logical groups ("DATAe" and "DATAf") may have different logical identifiers. In the example of FIG. 10, data group DATAe may have logical identifiers LADDx to LADDx+j. In a similar fashion, data group DATAf may have logical identifiers LADDy to LADDy+i. It is understood that while logical identifiers (LADDx to LADDx+j, LADDy to LADDy+i) may be logical addresses of some other memory system. In other applications such values may represent data from a particular source (e.g., a particular buffer or buffer portion, a particular input or output, particular logical endpoint, as but a few examples).

In operation, a processor system 1004 may execute read and write operations based on address translator 1028. More particularly, a processor system 1004 may receive data group DATAe for a data write, while outputting data group DATAf in a data read operation. Address translator 1028 may ensure that the two different data groups DATAe and DATAf are located in different banks, thus enabling separate bank read and write operations for such data values.

In this way, a system may include an address translator, or equivalent, for associating different data groups with different memory device banks, to direct rapid reads and writes to separate banks according to methods and devices shown herein, or equivalents.

While embodiments may include memory devices and systems, other embodiments may include methods of transferring data to and from a memory device. One example of such an embodiment is shown in FIG. 11.

Figure 11:
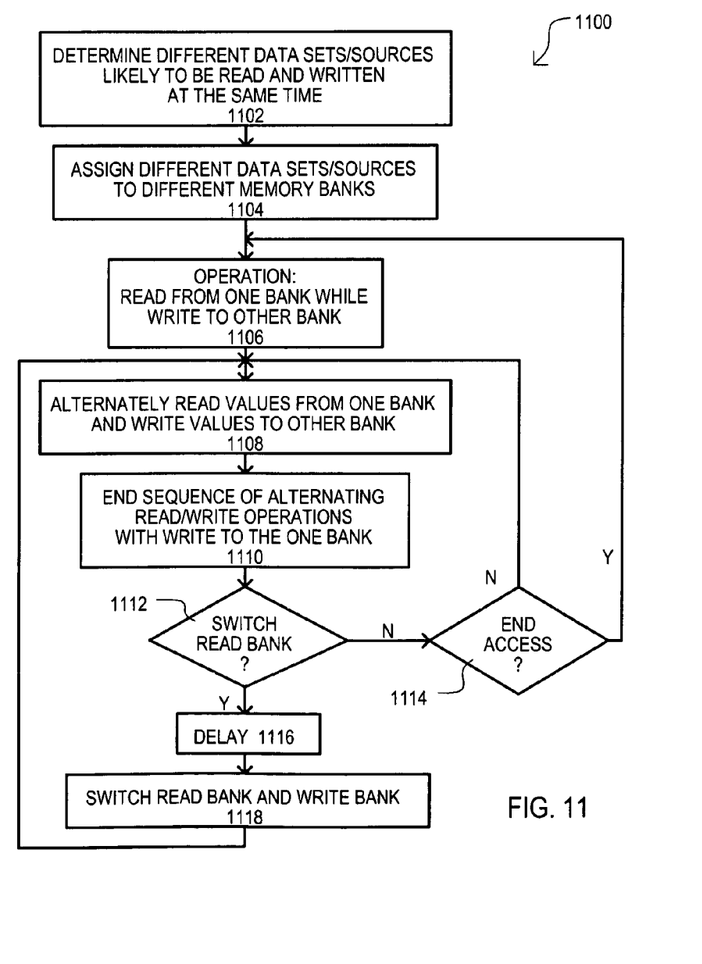
FIG. 11 is a flow diagram showing a method according to an embodiment.

Referring to FIG. 11, a method of transferring data according to one embodiment is shown in a flow diagram and designated by the general reference character 1100. A method may include determining different data sets (or sources) likely to be read and written at the same time (box 1102). Such an action may vary according to application, but may include identifying data sets (or source) likely to be subject to a write operation to a memory device, while the other data set (or source) is likely to be subject to a read operation, and vice versa. Differentiation of data sets/sources may vary between applications and/or architectures.

A method 1100 may also include assigning different data sets/sources to different banks (box 1104). As but two examples, such a step may include assigning a base address for different banks to different data sets and/or assigning a bank selection indication to different data sets.

A method 1100 may further include a read to one bank while a write occurs to another bank (box 1106). Such an action may include activating read and write enable signals in a memory device to enable reads from a read output, while at the same time enabling writes to a separate write input. Further, the reads and writes may be directed to different data sets.

A method 1100 may include alternately reading values of one data set from one bank and writing data values from another data set to another bank (box 1108). In one particular arrangement, such an action may include executing read operations on one portion of a timing clock (e.g., rising edge) and executing write operations on another portion of a timing clock (e.g., falling edge).

The particular method 1100 of FIG. 11 may also include ending a sequence of alternating read/write operations with a write to the one bank (the bank outputting read data) (box 1110).

Method 1100 may also including determining if a bank switch is to occur (box 1112). Such an action may include determining if a bank from which data is currently being read, is now a bank to which data is to be written, or determining if a bank to which data is currently being written is now a bank from which data is to be read.

If no bank switch is to occur (N from box 1112), a method 1100 may determine if an access is ended (box 1114). If an access is not ended (N from box 1114), a method 1100 may return to box 1108. If an access is ended (Y from box 1114), a method 1100 may return to box 1106.

In contrast, if a bank switch is to occur (Y from box 1112), a delay may be introduced (box 1116). As but one particular example, such an action may include introducing a "no operation" period to a memory device containing the banks.

A method 1100 may further include switching banks (box 1118). A method 1100 may include the return to box 1108 to execute alternate reads and writes based on the switched bank configuration.

Embodiments may be well suited to performing various other steps or variations of the steps recited herein, and in a sequence other than that depicted and/or described herein.

For purposes of clarity, many of the details of the various embodiments and the methods of designing and manufacturing the same that are widely known and are not relevant to the present embodiments have been omitted from the following description.

It should be appreciated that reference throughout this specification to "one embodiment" or "an embodiment" means that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments.

Similarly, it should be appreciated that in the foregoing description of exemplary embodiments, various features of the disclosed embodiments are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the embodiments require more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

It is also understood that the embodiments may be practiced in the absence of an element and/or step not specifically disclosed. That is, a feature of the embodiments may be an elimination of an element.

Accordingly, while the various aspects of the particular embodiments set forth herein have been described in detail, the present disclosure could be subject to various changes, substitutions, and alterations without departing from the spirit and scope thereof.

What is claimed is:

1. A method of reading and writing data to a memory device in a same time period, comprising:
   in a first sequence of accesses, alternately reading data values on a read output from a first bank in synchronism with a first part in a cycle of a first clock and writing data values to a second bank through a write output in synchronism with a second part in the cycle of the first clock, the sequence concluding with a last data value write to the first bank in synchronism with the second part in the cycle of the first clock, the first bank and second bank having separate write access circuits; and
   a time between consecutive read operations being shorter than a time for a back-to-back read and write operation to a same one of the banks.

2. The method of claim 1, wherein the read operations and write operations are initiated 180 degrees apart with respect to the first clock.

3. The method of claim 1, further including:
   alternately applying read addresses to the first bank in synchronism with the first part in the cycle of the first clock, and write addresses to the second bank in synchronism with the second part in the cycle of the first clock, the sequence concluding with a last write address to the first bank in synchronism with the second part in the cycle of the first clock.

4. The method of claim 1, further including:
   in response to a second sequence of accesses that alternately read data values from the second bank in synchronism with the first part in the cycle of the first clock, and write data values to the first bank in synchronism with the second part in the cycle of the second clock, introducing a delay between the last data value write of the first sequence of accesses and a start of the second sequence of accesses.

5. The method of claim 4, wherein the delay is no more than one clock cycle.

6. The method of claim 1, further including assigning first data for a given application to the first bank and assigning second data for the application to the second bank.

7. The method of claim 1, further including:
   in a second sequence of accesses, alternately reading data values from one of the first bank and the second bank in synchronism with a first part in a cycle of a second clock, and writing data values to the one of the first bank and the second bank in synchronism with a second part in the cycle of the second clock, the second clock being slower than the first clock.

8. A memory device, comprising:
at least a first bank and a second bank having separate write access circuits and separate write address decoders to decode write addresses and not read addresses; and
a timing circuit that is configured to enable a write to the second bank to occur after a read from the first bank, in a smaller amount of time than a sequential read and write operation in the first bank, wherein the timing circuit is configured to enable the read from the first bank during a first part in a cycle of a clock and the write to the second bank during a second part in the cycle of the clock.

9. The memory device of claim 8, wherein each bank has separate read access circuits and separate read address decoders that decode read addresses and not write addresses.

10. The memory device of claim 9, further including:
an address register coupled to a plurality of address inputs; and
the read decoders and write decoders are commonly coupled to the address register.

11. The memory device of claim 8, wherein:
the first bank write access circuit includes a first write register activated in synchronism with a first type transition of a first periodic clock signal; and
the second bank write access circuit including a second write register activated in synchronism with a second type transition of the first periodic clock signal.

12. The memory device of claim 11, further including:
a third bank and a fourth bank having separate write access circuits; and
the timing circuit enables writes to the second bank, third bank and fourth banks to occur in a smaller amount of time than a sequential read and write operation in the first bank.

13. The memory device of claim 12, wherein:
the third bank write access circuit includes a third write register activated in synchronism with a first type transition of a second periodic clock signal; and
the fourth bank write access circuit include a fourth write register activated in synchronism with a second type transition of the second periodic clock signal.

14. The memory device of claim 8, further including:
a variable clock circuit that generates a first clock signal in response to alternating read and write accesses to different banks and a second clock signal in response to alternating read and write accesses to the same bank, the second clock signal being slower than the first clock signal.

15. A method comprising:
on first transitions of a first clock signal, latching a read address for a first bank and outputting data from an array in the first bank after a bank read access time period;
on second transitions of the first clock signal, latching a write address for a second bank, inputting and storing data to an array in the second bank after a bank write access time period; and
the second transitions occur after the first transitions in less than a sum of the bank read access and bank write access time periods, wherein there are no other transitions of the first clock signal between the first transitions and the second transitions.

16. The method of claim 15, wherein when transitioning from sequential reads from the first bank and writes to the second bank to sequential reads from the second bank and writes to the first bank, latching a last write address for the first bank.

17. The method of claim 16, further including:
suspending the execution of any new reads and writes for a predetermined transitions time period following the latching of the last writes address for the first bank, and prior to reading from the second bank.

18. The method of claim 17, wherein the predetermined transition time period is no less than the bank write access time period.

19. The method of claim 15, further including:
the second transitions of the first clock signal are phase shifted from the first transitions of the first clock signal by 180 degrees;
latching the read address for the first bank includes applying a read address value on an address bus, and latching the write address for the second bank includes applying a write address value on the address bus;
following the latching of the read address for the first bank, outputting read data on a read data output; and
on second transitions of the first clock signal, applying write data on a write data input separate from the read data output.

20. The method of claim 15, further including:
on first transitions of a second clock signal, latching a read address for a third bank and outputting data from an array in the third bank after the bank read access time period; and
on second transitions of the second clock signal, latching a write address for a fourth bank, inputting and storing data to an array in the fourth bank after the bank write access time period; wherein
the second clock signal is phase shifted by 90 degrees with respect to the first clock signal.

* * * * *